United States Patent
Badets et al.

(10) Patent No.: US 12,340,298 B2
(45) Date of Patent: Jun. 24, 2025

(54) MULTI-INJECTION PHASE-SUMMING CIRCUIT

(71) Applicant: COMMISSARIAT A L'ENERGIE ATOMIQUE ET AUX ENERGIES ALTERNATIVES, Paris (FR)

(72) Inventors: Franck Badets, Grenoble (FR); Jean-Baptiste Casanova, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 888 days.

(21) Appl. No.: 17/531,508

(22) Filed: Nov. 19, 2021

(65) Prior Publication Data

US 2022/0164632 A1  May 26, 2022

(30) Foreign Application Priority Data

Nov. 24, 2020 (FR) ...................................... 2012054

(51) Int. Cl.
G06N 3/049 (2023.01)
G06N 3/065 (2023.01)

(52) U.S. Cl.
CPC ............. *G06N 3/049* (2013.01); *G06N 3/065* (2023.01)

(58) Field of Classification Search
CPC ........ G06N 3/049; G06N 3/065; G06N 3/045; G06N 3/048; G06N 3/063; H03L 7/24;
(Continued)

(56) References Cited

U.S. PATENT DOCUMENTS 6,317,008 B1  11/2001  Gabara
9,673,828 B1  6/2017  Xu et al.
(Continued)

FOREIGN PATENT DOCUMENTS

EP  1 376 869 A1  1/2004
EP  3 312 568 A1  4/2018
FR  3 057 658 A1  4/2018

OTHER PUBLICATIONS

Korniienko, et al., "H∞ loop shaping control for distributed PLL network", 2009 Ph.D. Research in Microelectronics and Electronics, Jul. 12, 2009.
(Continued)

*Primary Examiner* — Jung Kim
(74) *Attorney, Agent, or Firm* — BakerHostetler

(57) ABSTRACT

A multi-injection phase-summing circuit includes an oscillator having a natural frequency of oscillation F0, a reference injection interface circuit controlled by a reference synchronization signal at a reference frequency and at least one additional injection interface circuit controlled by a secondary synchronization signal at the reference frequency, each injection interface circuit having a variable injection parameter, the secondary synchronization signals each being phase shifted with respect to the reference synchronization signal, the oscillator being configured to generate an output signal at the reference frequency and phase shifted with respect to the reference synchronization signal by a phase shift dependent on a sum of the respective phase shifts of each secondary synchronization signal with respect to the reference synchronization signal, said sum being weighted by the injection parameters.

15 Claims, 8 Drawing Sheets

(58) Field of Classification Search
CPC .. H03L 7/00; G06F 1/12; H03K 5/135; H03K 5/13; H03K 19/096; H03K 2005/00052
See application file for complete search history.

(56) References Cited

U.S. PATENT DOCUMENTS 10,873,293 B2    12/2020  Badets
2014/0266480 A1*  9/2014  Li .................... H03B 5/1243
                                                    331/117 FE

OTHER PUBLICATIONS

Bankman et al. "An always-on 3.8μJ/ 86% CIFAR-10 mixed-signal binary CNN processor with all memory on-chip in 28 nm CMOS", 2018 IEEE International Solid—State Circuits Conference—(ISSCC), 2018.

Valentian, et al. "Fully Integrated Spiking Neural Network with Analog Neurons and RRAM synapses", 2019 IEEE International Electron Devices Meeting (IEDM), 2019.

Romera et al., "Vowel recognition with four coupled spin-torque nano-oscillators", Nature, vol. 563, pp. 230-234, 2018.

Jackson, et al., "An RRAM-Based Oscillatory Neural Network", 2015 IEEE 6th Latin American Symposium on Circuits & Systems (LASCAS), Feb. 2015.

* cited by examiner

MULTI-INJECTION PHASE-SUMMING CIRCUIT

CROSS-REFERENCE TO RELATED APPLICATIONS

This application claims priority to foreign French patent application No. FR 2012054, filed on Nov. 24, 2020, the disclosure of which is incorporated by reference in its entirety.

FIELD OF THE INVENTION

The invention relates to the field of computational circuits for taking weighted sums, in particular for the field of artificial neural networks.

BACKGROUND

In applications requiring algorithms that are very costly in terms of mathematical operations, such as artificial-intelligence applications and in particular artificial-intelligence applications employing artificial neural networks, the most complex functions are generally performed in a remote server, a cloud server for example. Such physical or virtual servers have a high computing power, this allowing the algorithms that are the most costly in terms of operations to be implemented remotely.

However, this solution has drawbacks in terms of volume of communications (bandwidth available to access the server), data security and the latency induced by the remote access to the server.

It would therefore be advantageous to be able to perform these computations in circuits close to the sensors that generate the data to be processed, in order to limit connections to the cloud server.

To this end, it is necessary to decrease the consumption and footprint occupied by the circuit performing the basic algorithm—the function of an artificial neuron for example.

In the field of implementations of artificial neural networks, various analogue or hybrid architectures have been described in the literature.

A first solution, described in document [1], aims to produce an artificial neuron in the analogue/hybrid domain by taking a weighted sum by means of a charge redistribution digital-to-analogue converter. In order to simplify multiplication operations, the inputs can take only three values 1, −1, 0. An analogue comparator is used to deliver the result of the computation. A better consumption and a lower footprint are obtained with respect to digital implementations. Nevertheless, the use of analogue and hybrid blocks (DAC and comparator) induces a sensitivity to PVT variations (PVT standing for process, voltage and temperature). Furthermore, the presence of DACs is disadvantageous to the footprint of a neuron.

A second solution described in [2] relates to spiking neural networks, in which information is transmitted via variation of a density of spikes output from the neuron. In particular, the solution described in this document replaces the current-mode analogue-to-digital converters used to store the weights of the synapses with RRAM memories, this allowing a good integration density to be obtained. The consumption of the solution benefits from the analogue implementation of the neuron, but also from the asynchronous behaviour of the neuron. Nevertheless, the analogue design makes the circuit sensitive to variabilities in the fabrication process, in the supply voltage and in temperature.

A third solution described in [3] aims to produce trainable networks using coupled oscillators. In contrast to the solution that is the subject of the present invention, the output of the network is read in the domain of the frequencies of the oscillators and not in the phase domain. These solutions may be based on nano-magnetic oscillators. The advantage of these oscillators is their nanoscale dimensions, which allow a very high integration density to be envisaged. Furthermore, these oscillators have very high frequencies, this allowing a very high energy efficiency to be envisaged. However, frequency-domain read-out is more difficult and requires auxiliary lock detection circuits. Furthermore, the output signals are of the order of one mV and are difficult to exploit without amplification.

A fourth solution described in [4] relates to oscillatory neural networks based on phase-locked-loop circuits. The main advantage of these architectures is a better robustness to PVT variations due to the fact that the information is contained in a measurement of phase differential between the output neurons. However, the use of one phase-locked-loop circuit per neuron is very disadvantageous in terms of footprint because of the presence of one passive loop filter for each neuron.

Injection-locked oscillators, which are for example described in patent applications FR1660100 and FR1872714, are moreover known.

SUMMARY OF THE INVENTION

The invention provides a phase-domain summing circuit that is especially usable to produce an oscillatory neural network. The circuit according to the invention is based on one locked oscillator per a plurality of injection interface circuits that are controlled by synchronization signals that are at the same frequency but phase shifted with respect to one another. The phase shifts allow the input and output signals of the neuron to be encoded. The synaptic weights are adjusted via the amplitudes of the injection currents or of the local impedances of each injection interface circuit. In the following description, we mean by "injection parameter" one of these two parameters: the injection current or the local impedance of an injection interface circuit.

The invention especially has the advantage of encoding information in the phase domain, which allows the supply voltage to be greatly decreased and therefore the power consumed by the circuit compared to analogue-hybrid solutions.

Moreover, the proposed solution has an optimum footprint with respect to solutions based on phase-locked loops because it requires only a single basic oscillator.

Information encoded in the phase domain is more easily exploitable than information encoded in the frequency domain.

The information is in practice encoded via phase differences with respect to a reference signal, this making the measurements less sensitive to PVT variations.

The invention is applicable to the field of neural networks but more generally to any circuit that requires a weighted sum of signals to be taken. For example, the invention allows a phase integrator to be produced.

One subject of the invention is a multi-injection phase-summing circuit comprising an oscillator having a natural frequency of oscillation $F_0$, a reference injection interface circuit controlled by a reference synchronization signal at a reference frequency and at least one additional injection interface circuit controlled by a secondary synchronization signal at the reference frequency, each injection interface circuit having a variable injection parameter, the secondary synchronization signals each being phase shifted with respect to the reference synchronization signal, the oscillator being configured to generate an output signal at the reference frequency and phase shifted with respect to the reference synchronization signal by a phase shift dependent on a sum of the respective phase shifts of each secondary synchronization signal with respect to the reference synchronization signal, said sum being weighted by the injection parameters.

In one variant embodiment, the phase-summing circuit according to the invention further comprises a converter of data into phases in order to control the respective phase shifts of the secondary synchronization signals with respect to the reference synchronization signal.

According to one particular aspect of the invention, the oscillator is a relaxation oscillator.

According to one particular aspect of the invention, the injection parameter is an injection current and each injection interface circuit is configured to inject, as input into the oscillator, the injection current synchronously with the synchronization signal that controls it.

According to one particular aspect of the invention, the oscillator comprises first and second capacitors arranged to be in two opposite states among a charging state and a discharging state, respectively, each capacitor switching from the discharging state to the charging state by being charged by a current source internal to the oscillator.

According to one particular aspect of the invention, the oscillator comprises first and second charging transistors and a flip-flop having a first data output coupled to the gate of the first transistor and a second data output, complementary to the first output, coupled to the gate of the second transistor, the flip-flop furthermore having a synchronization input coupled to the first capacitor and a reset input coupled to the second capacitor.

According to one particular aspect of the invention, each injection interface circuit is configured to charge or discharge the first and second capacitors using the injection current.

According to one particular aspect of the invention, each injection interface circuit comprises one independent current source for generating the injection current.

According to one particular aspect of the invention, each injection interface circuit comprises an RRAM memory for generating the injection current.

According to one particular aspect of the invention, the injection parameter is a load impedance and each injection interface circuit is configured to modify the value of at least one load impedance of the oscillator synchronously with the synchronization signal that controls it.

According to one particular aspect of the invention, the reference frequency is set equal to the natural frequency of oscillation F0 of the oscillator.

According to one particular aspect of the invention, the oscillator is a nano-magnetic oscillator.

Another subject of the invention is a neuronal circuit comprising a phase-summing circuit according to the invention and an actuation circuit in the phase domain configured to deliver as output an actuation signal that is a non-linear function of the signal output by the oscillator.

Yet another subject of the invention is an oscillatory neural network comprising a plurality of neuronal circuits according to the invention, wherein the signals propagated through the network are coded in phase and the synaptic weights of the network are coded depending on the values of the injection parameters of the injection interface circuits.

According to one particular aspect of the invention, the reference synchronization signal is common at least to all the neuronal circuits forming a given layer of neurons.

BRIEF DESCRIPTION OF THE DRAWINGS

Other features and advantages of the present invention will become more clearly apparent upon reading the following description with reference to the following appended drawings.

DETAILED DESCRIPTION

Although the invention is described below mainly with respect to an embodiment that relates to artificial neural networks, it is not limited to this application and is compatible with any computing circuit requiring a weighted sum of phase-encoded signals to be taken.

Figure 1:
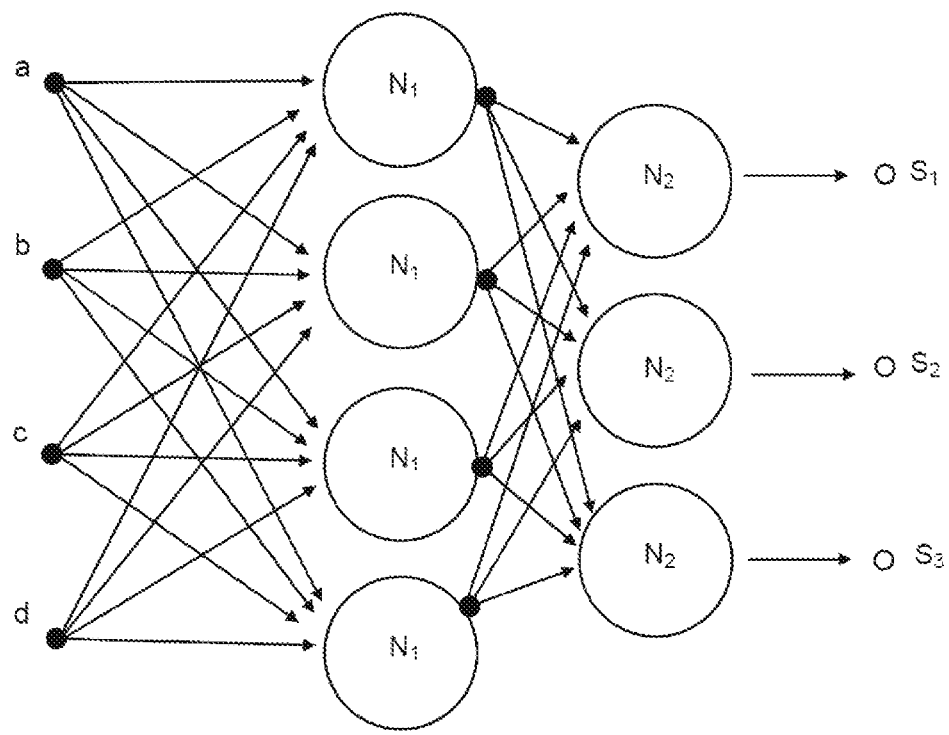
FIG. 1 shows a diagram of one example of an artificial neural network.

FIG. 1 shows a functional diagram of an artificial neural network comprising a plurality of layers of neurons, each neuron being connected to one or more neurons of the following layer and/or of the preceding layer. In the example of FIG. 1, only two layers of neurons have been shown, but the number of layers is in general higher. Likewise, the number of neurons per layer is also in general higher than in the illustrated example.

The general principle of a neural network is that each neuron receives a plurality of input signals (originating from the inputs of the network or from neurons of the preceding layer) and delivers an output of the same type that is propagated to the neurons of the following layer.

In the example of FIG. 1, each neuron is connected to all the neurons of the following layer, it is a fully connected network. However, so-called convolutional networks, in which each neuron is connected to only some of the neurons of the following layer, also exist.

Figure 2:
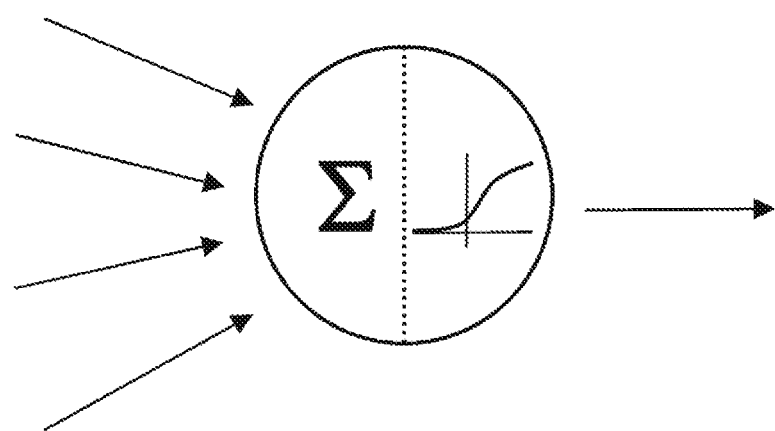
FIG. 2 shows a functional diagram of a neuron.

FIG. 2 schematically shows the operating principle of a neuron, which computes a function that returns a weighted sum of its inputs, followed by a non-linear function.

Analytically, the function computed by a neuron is given by the relationship:

$$y = f(\Sigma[\omega_i \cdot x_i] + b)$$

where f is a non-linear function that represents the activation function of the neuron, $x_i$ are the input data, $\omega_i$ are the synaptic weights and b is a bias.

One objective of the invention is to perform a computation of a weighted sum in the phase domain by means of an injection-locked oscillator circuit.

Figure 3:
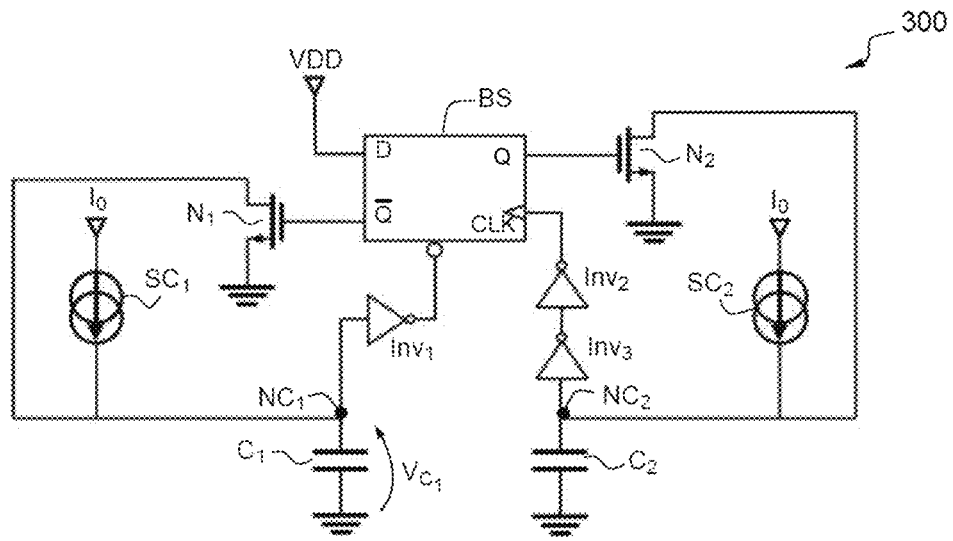
FIG. 3 shows a circuit diagram of a relaxation oscillator circuit.

FIG. 3 shows a circuit diagram of a relaxation oscillator 300.

The oscillator 300 comprises a type-D flip-flop BS having a data input D coupled to a supply voltage VDD and having two complementary outputs Q and $\overline{Q}$.

The output $\overline{Q}$ is coupled to the gate of a first transistor N1, for example an n-channel MOS transistor, which is coupled between ground and a first capacitive node NC1.

The node NC1 is coupled to ground via a capacitor C1 and receives a current from a current source SC.

The output Q is coupled to the gate of a second transistor N2, for example an n-channel MOS transistor, which is coupled between ground and a second capacitive node NC2.

The node NC2 is coupled to ground via a capacitor C2 and receives a current from the same current source SC.

In one variant embodiment, the current source SC is replaced by a resistor or by an RRAM memory.

The node NC1 is furthermore coupled to a reset input Rst of the flip-flop BS via an inverter Inv1.

The node NC2 is coupled to a clock input of the D flip-flop via the series connection of a pair of inverters Inv2,Inv3.

The oscillator illustrated in FIG. 3 is said to be a relaxation oscillator because it operates by constraint that is uniform to the voltage across the terminals of the capacitors C1,C2.

The capacitors C1,C2 may be in two distinct states among a discharging state and a charging state.

When a capacitor C1,C2 is in a discharging state, the transistor that corresponds thereto is turned on and the capacitor is short-circuited between two grounds.

When a capacitor is in a charging state, the transistor that corresponds thereto is turned off and the capacitor is charged by the current source SC.

Since the gates of the transistors N1,N2 are connected to the complementary outputs of the D flip-flop, the transistors can only be on or off and cannot be in the same state at the same time.

For example, if the capacitor C1 is in a charging state, the output Q is at the voltage VDD and the output $\overline{Q}$ is at 0. Under these conditions, the transistor N1 is turned off, the transistor N2 is turned on and the capacitor C2 is in discharging state. The voltage on the node NC1 increases, charged by the current source SC, to a threshold voltage Vth that corresponds to the switching threshold of the inverters. Passage to the threshold voltage Vth causes the D flip-flop to switch.

On switching of the flip-flop, the output Q passes from VDD to 0, the capacitor C1 passes to discharging state and the capacitor C2 passes to charging state. The cycle continues thus and on the output Q a square-wave signal is obtained with a natural frequency $F_0$ given by the following relationship:

$$F_0 = \frac{I_0}{2CV_{th}}$$

with C the common capacitance of the two capacitors C1,C2 and $I_0$ the value of the charging current injected into the capacitor-connected nodes NC1,NC2.

A signal that is identical but in phase opposition appears on the output $\overline{Q}$.

Figure 4:
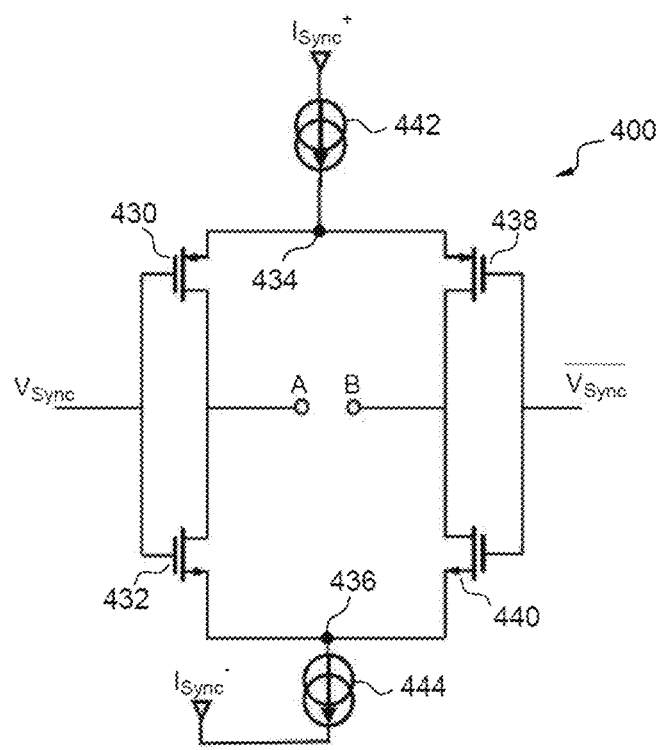
FIG. 4 shows a circuit diagram of an injection interface circuit.

FIG. 4 shows a circuit diagram of an injection interface circuit 400.

The interface circuit 400, which is also referred to as the injection-locking circuit, comprises a differential transimpedance amplifier comprising transistors 430 and 432 coupled in series via their main conduction nodes between nodes 434 and 436, and transistors 438,440 coupled via their main conduction nodes between the nodes 434 and 436.

The transistors 430 and 438 are for example p-channel MOS transistors and the transistors 432,440 are for example n-channel MOS transistors.

The gates of the transistors 430,432 are coupled so as to receive an input signal $V_{sync}$, called the synchronization signal, which is a square-wave signal with a reference frequency $F_{sync}$.

The gates of the transistors 438,440 are coupled so as to receive an input signal that is the inverse of the synchronization signal.

The node 434 is coupled to a first current source 442 able to generate a positive injection current $I_{sync}$. The node 436 is coupled to a second current source 444 able to generate an opposite negative injection current $-I_{sync}$.

Figure 5:
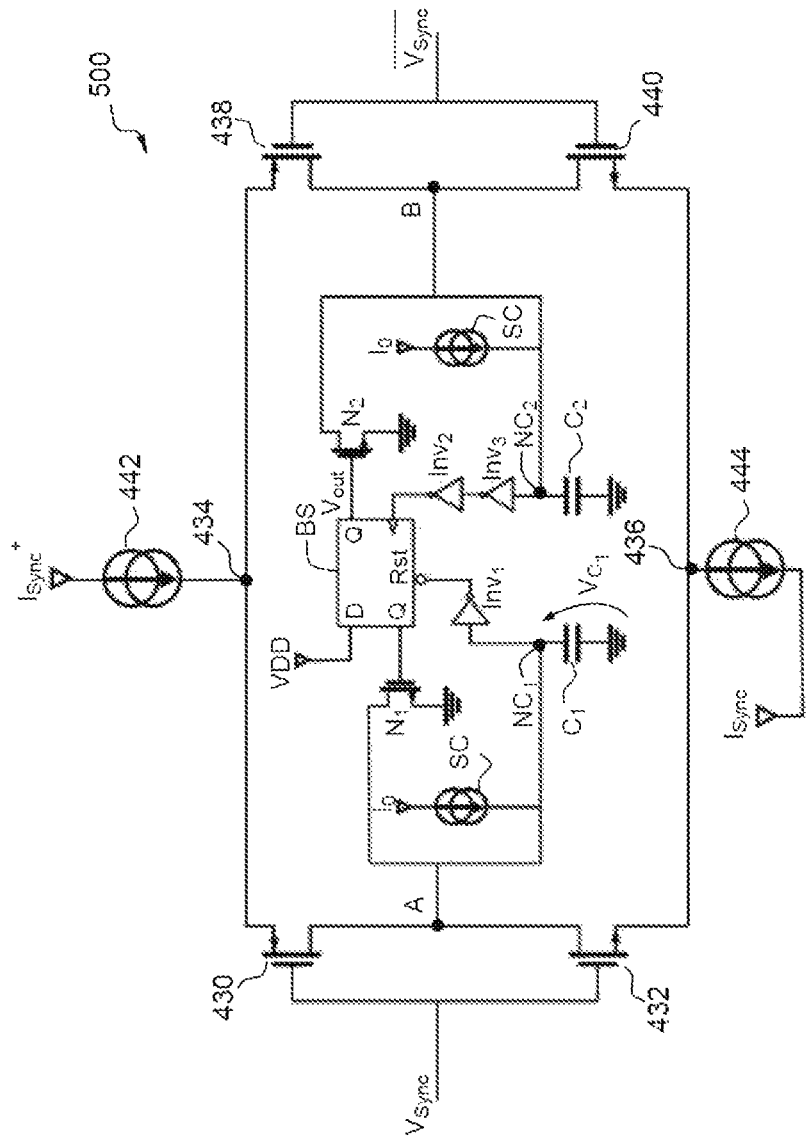
FIG. 5 shows a circuit diagram of an injection-locked oscillator circuit according to a first embodiment of the invention.

The interface circuit 400 is then coupled to the relaxation oscillator 300 in order to produce an injection-locked oscillator 500 such as illustrated in FIG. 5.

The intermediate node A between the transistors 430,432 is coupled to the node NC1. The intermediate node B between the transistors 438,440 is coupled to the node NC2.

Figure 6:
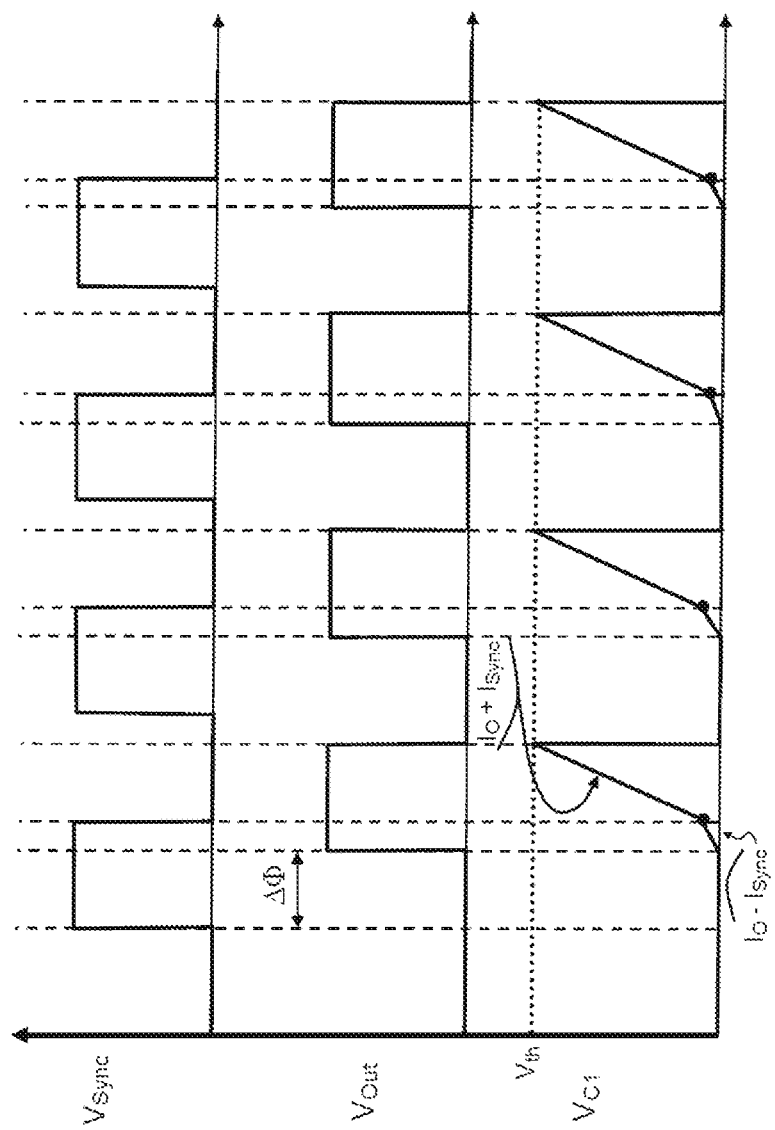
FIG. 6 illustrates, via a plurality of timing diagrams, the operation of the injection-locked oscillator circuit.

The operation of the oscillator 500 will now be described with reference to the timing diagrams of FIG. 6, which show the synchronization signal $V_{sync}$, the signal $V_{out}$ on the output Q of the flip-flop BS and the voltage $V_{C1}$ across the terminals of the capacitor C1.

Initially, it is assumed that the signal $V_{out}$ on the output Q of the flip-flop BS is in the low state, the transistor N2 is therefore turned off and the transistor N1 turned on. The voltage $V_{C1}$ across the terminals of the capacitor C1 is therefore pulled to ground and the capacitor C2 is charged by the current source SC and by the signal opposite to the synchronization signal $V_{sync}$.

When the voltage across the terminals of the capacitor C2 reaches the switching threshold of the inverters Inv2,Inv3, the flip-flop BS is reset and the signal $V_{out}$ on the output Q passes to the high state.

The capacitor C1 is then charged by the current source SC and also by the negative injection current $-I_{sync}$. When the synchronization signal $V_{sync}$ again passes to the low state, the positive injection current $I_{sync}$ is injected and the capacitor C1 is then charged by $I_0 + I_{sync}$, until the voltage $V_{C1}$ reaches the triggering threshold of the inverter Inv1 which will reset the flip-flop BS and make the signal $V_{out}$ pass to the low state.

Considering an oscillator having a duty cycle of 50% so as to reason with respect to a half-period, the average current passing through the capacitor C1 may be calculated by means of the following relationship:

$$<I> = (1-\alpha)(I_0 - I_{sync}) + \alpha(I_0 + I_{sync}) \quad (1)$$

with $$\alpha = \frac{\Delta\phi}{\pi}$$

and $\Delta\phi$ the phase shift induced by the injection mechanism between the signal $V_{out}$ and the synchronization signal $V_{sync}$.

Moreover, the frequency of the synchronization signal and the average current flowing through the capacitor C1 are related by the following relationship:

$$F_{sync} = \frac{<I>}{2CV_{th}},$$

C being the capacitance of the capacitors C1 and C2.

It may be deduced therefrom that:

$$\alpha = \frac{1}{2} + \frac{1}{2 \cdot I_{sync}}(<I> - I_0) \quad (2)$$

$$\Delta\phi = \frac{\pi C V_{th}}{I_{sync}}(F_{sync} - F_0) + \frac{\pi}{2}$$

In one particular case, if $F_{sync} = F_0$, the phase shift is equal to $$\frac{\pi}{2}.$$

Figure 7:
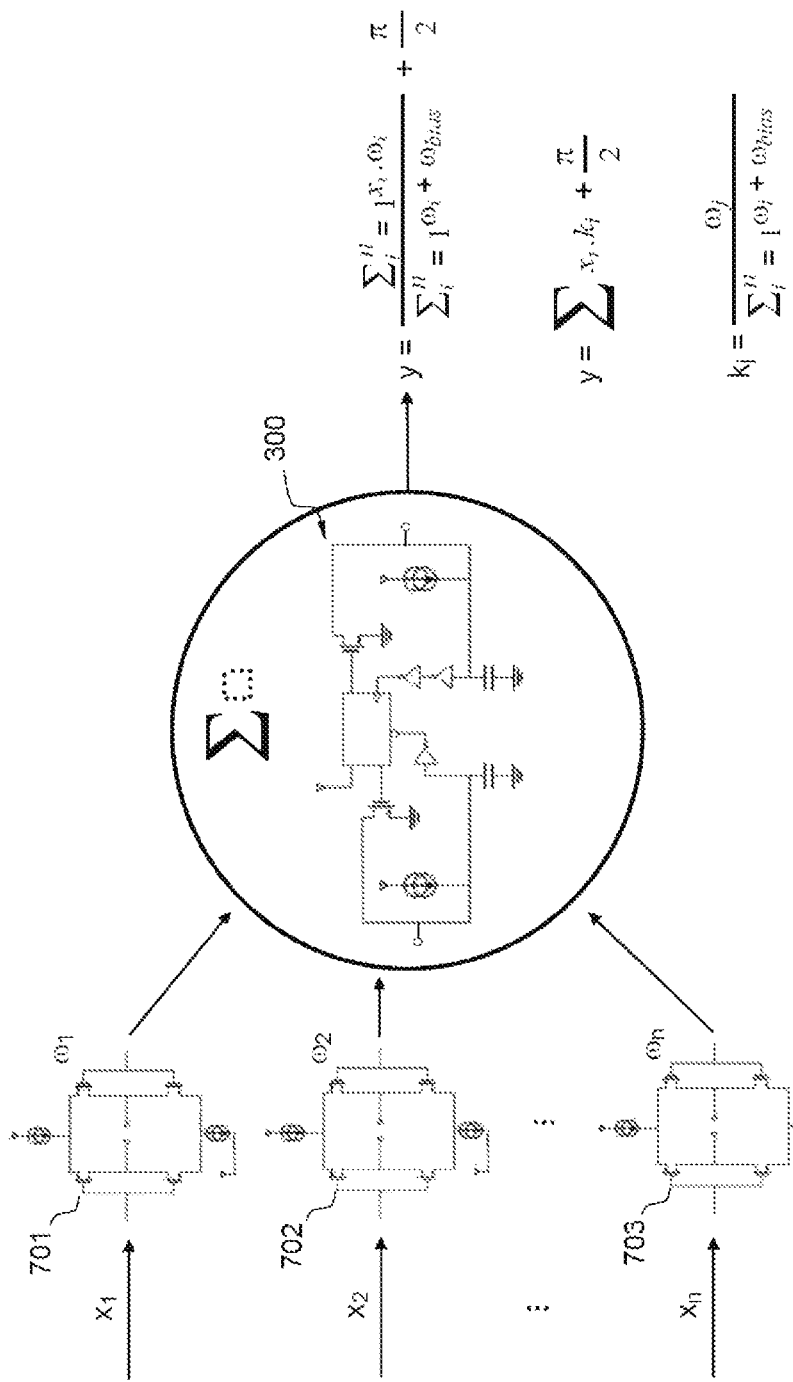
FIG. 7 shows a circuit diagram of a neuronal circuit according to the invention.

FIG. 7 illustrates, with a diagram, the use of a relaxation oscillator 300 coupled to a plurality of injection interface circuits 701, 702, 703 in order to produce a phase-summing circuit according to one embodiment of the invention.

The invention consists in connecting a plurality of injection interface circuits of the type illustrated in FIG. 4 to a relaxation oscillator 300 of the type illustrated in FIG. 3.

In other words, the intermediate nodes A,B of each injection interface circuit 701, 702, 703 are connected to the nodes A,B of the oscillator 300 shown in FIG. 7 in order to charge the capacitors C1,C2, respectively.

Each injection interface circuit 701, 702, 703 is controlled by a separate synchronization signal and a separate current source. The synchronization signals of the various circuits are all at the same frequency $F_{sync}$, which may be equal to the natural frequency of the oscillator 300 or be different therefrom.

The values of the injection currents are controlled independently for each injection interface circuit.

As indicated above, the circuit shown in FIG. 7 may be used as a neuronal circuit to produce an artificial neuron. In this case, the input signals of the neuron $x_1$, $x_2$, $x_n$ are encoded by phase differences and the synaptic weights $\omega_1$, $\omega_2$, $\omega_n$ correspond to the values of the injection currents.

More precisely, the input signals are encoded by the phase differences between the synchronization signals of the circuit 701, 702, 703.

Figure 8:
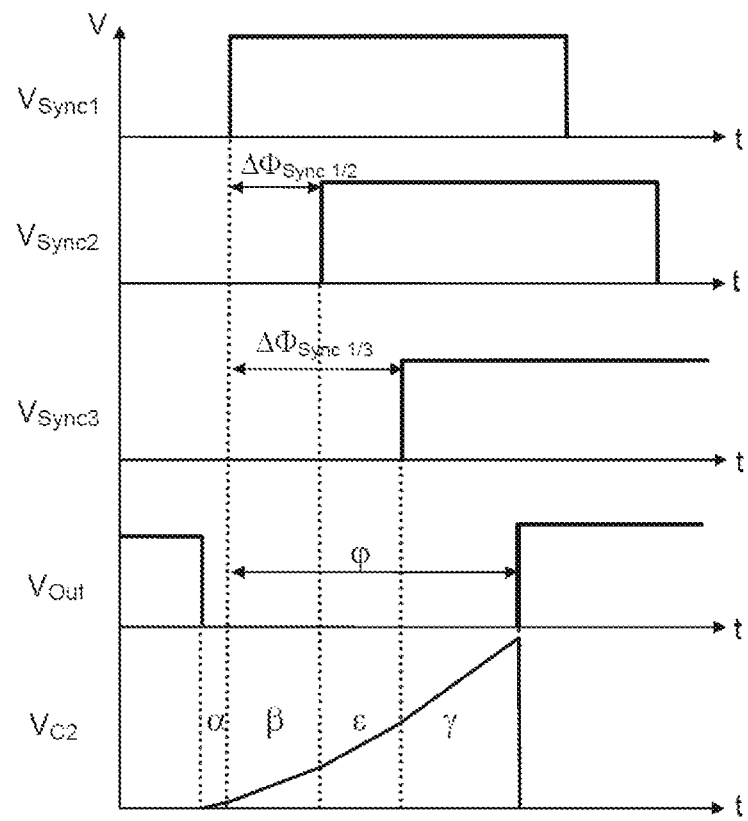
FIG. 8 illustrates, via a plurality of timing diagrams, the operation of the neuronal circuit according to the invention.

FIG. 8 shows one example of timing diagrams in order to illustrate the operation of the circuit according to the invention. In these timing diagrams three synchronization signals $V_{sync1}$, $V_{sync2}$, $V_{sync3}$, the output signal $V_{out}$ of the oscillator and the voltage $V_{C2}$ across the terminals of the capacitor C2 have been shown.

One of the synchronization signals, for example the signal $V_{sync1}$ in the example of FIG. 8, is taken as reference. The two other synchronization signals are phase shifted with respect to the reference signal. The input signals correspond to these two phase shifts $\Delta\phi_{sync1/2}$ and $\Delta\phi_{sync1/3}$.

In the example of FIG. 8, during the time interval $\alpha$, the capacitor C2 is charged by the current $I_0 - I_{sync1} - I_{sync2} - I_{sync3}$. During the time interval $\beta$, the capacitor C2 is charged by the current $I_0 + I_{sync1} - I_{sync2} - I_{sync3}$. During the time interval $\varepsilon$, the capacitor C2 is charged by the current $I_0 + I_{sync1} + I_{sync2} - I_{sync3}$. During the time interval $\gamma$, the capacitor C2 is charged by the current $I_0 + I_{sync1} + I_{sync2} + I_{sync3}$.

Applying the same reasoning as above to an oscillator with a single injection, it is shown that the average current flowing through the capacitor C1 is given by the relationship:

$$<I> = \alpha(I_0 - I_{sync1} - I_{sync2} - I_{sync3}) + \beta(I_0 + I_{sync1} - I_{sync2} - I_{sync3}) + \varepsilon(I_0 + I_{sync1} + I_{sync2} - I_{sync3}) + \gamma(I_0 + I_{sync1} + I_{sync2} + I_{sync3}) \quad (3)$$

with $1 = \alpha + \beta + \varepsilon + \gamma$

Developing the calculation in a similar way to that used to pass from relationship (1) to relationship (2), it may be demonstrated that the phase shift between the output signal $V_{out}$ and the reference signal $V_{sync1}$ may be expressed in the form:

$$\varphi = \frac{1}{I_{sync_1} + I_{sync_2} + I_{sync_3}} \cdot (C \cdot V_{Th} \cdot \pi \cdot (F_{Sync} - F_0) + \Delta\Phi_{Sync1/2} \cdot I_{sync_2} + \Delta\Phi_{Sync1/3} \cdot I_{sync_3}) + \frac{\pi}{2} \quad (4)$$

And if $F_{sync} = F_0$, $$\varphi = \frac{1}{I_{sync1} + I_{sync2} + I_{sync3}} \cdot (\Delta\Phi_{Sync1/2} \cdot I_{sync2} + \Delta\Phi_{Sync1/3} \cdot I_{sync3}) + \frac{\pi}{2}$$

More generally, using N+1 injection interface circuits, the output signal of the oscillator 300 has a phase shift with respect to the reference synchronization signal that is of the type:

$$\varphi = \frac{\sum_{i=1}^{n} \varphi_i I_i}{\sum_{i=1}^{n} I_i + I_{ref}} + \frac{\pi}{2}$$

$I_{ref}$ corresponds to the injection current of the interface circuit that serves as reference.

$\varphi_i$ corresponds to the phase shift between the synchronization signal of the injection interface circuit of index i and the reference synchronization signal.

Thus, it is possible to produce a weighted phase-summing circuit with this configuration by choosing a reference frequency $F_{sync}$ equal or close to the fundamental frequency $F_0$ of the oscillator.

One advantage of setting $F_{sync}=F_0$ is that it allows the transfer function of the circuit to be simplified to reach Equation (4).

Without departing from the context of the invention, the relaxation oscillator may be replaced by any type of oscillator controllable by current injection or more generally any type of oscillator controllable by injection.

French patent application FR 1872714 for example describes a variable load impedance oscillator controllable by injection that is compatible with implementation of the present invention.

The relaxation oscillator may also be replaced by a nano-magnetic oscillator.

Advantageously, the reference synchronization signal may be common to all the neurons of a given layer or to all the neurons of a network so as to have the same reference phase shift for all the signals propagating through the network.

In one embodiment, the neural network designed using a phase-summing circuit according to the invention comprises a converter or an encoder for converting the input signals into the phase domain. The input signals are, for example, obtained from sensors. The converter is, for example, a voltage-to-phase converter such as described in patent application FR3057658 of the Applicant.

In one variant embodiment, the current sources of the oscillator 300 are replaced by resistors or by RRAM memories. In this case, the charging curve of the capacitors is no longer linear but has an exponential shape, this inducing a different relationship between the phase shifts but that still corresponds to a weighted sum. One advantage of the use of RRAM memories is that they are also used to store the values of the synaptic weights.

As indicated in the preamble, the function computed by a neuron is given by the relationship:

$$y=f(\Sigma[\omega_i \cdot x_i]+b)$$

where f is a non-linear function that represents the activation function of the neuron.

A complete neuronal circuit thus comprises a phase-summing circuit according to the invention and an activation circuit able to execute the non-linear activation function f on the output of the phase-summing circuit.

Figure 9:
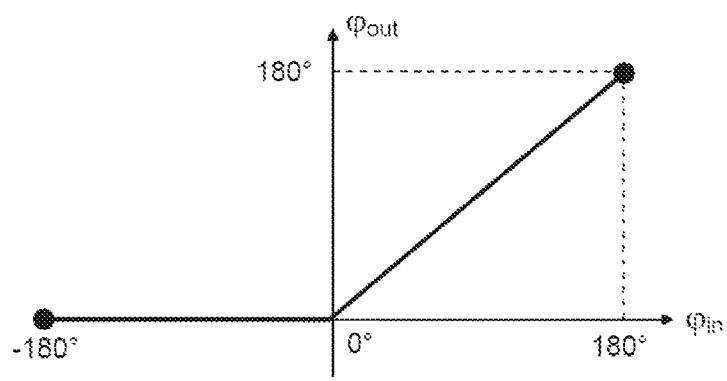
FIG. 9 illustrates, in a graph, a first example of an activation function for producing an artificial neuron.

FIG. 9 shows, by way of a first example of an activation function, the function known as the ReLu function, which consists in:
if the input phase φin is negative, applying a zero output phase φout,
if the input phase φin is positive, copying the input phase to the output phase φout.

The result of the function is 2π periodic and therefore the transfer function is defined only in the interval]−180°: 180°[.

Figure 10:
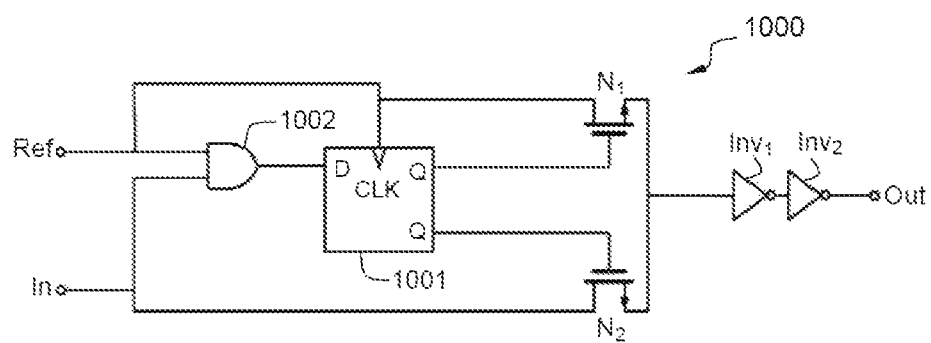
FIG. 10 shows a circuit diagram of one example of an activation circuit able to produce the activation function of FIG. 9.

To implement this first example of an activation function, the activation circuit 1000 of FIG. 10 is proposed by way of example of embodiment.

It comprises a D flip-flop 1001, an AND logic gate 1002, two transistors N1,N2 and two inverters Inv1,Inv2.

This circuit comprises a first input that receives a reference signal Ref (representing the value 0) and a second input In that receives the phase output by the phase-summing circuit described above.

The activation circuit 1000 allows the reference signal Ref to be copied to the output Out when the second input In is negative and the second input In to be copied to the output Out when the second input In is positive.

The activation circuit 1000 triggers on the rising edge of the reference signal Ref. The D flip-flop 1001, which is sensitive to this rising edge, copies the logic state (Ref AND In) output by the AND gate 1002 to the data output Q. If this result is 1, this means that the rising edge of the reference signal is located between the rising edge and the falling edge of the second input In. The phase received on this second input In is therefore negative and the reference signal is copied to the output Out. The output Q allows the reference signal to pass, through the transistor N1, to the output Out. The signal is amplified using two inverters Inv1,Inv2 in order to be able to deliver enough energy for a plurality of outputs.

In the case where the output of the AND gate 1002 is equal to 0, this means that the rising edge of the signal Ref is between the falling edge and the rising edge of the input signal In. The phase is therefore positive and the second input In is copied to the output.

Without departing from the context of the invention, other implementations of such a circuit are envisageable.

Figure 11:
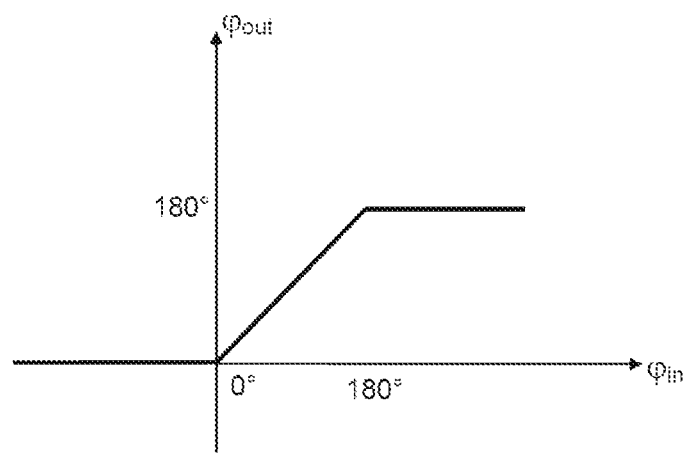
FIG. 11 illustrates, in a graph, a second example of an activation function for producing an artificial neuron.

FIG. 11 shows a second example of an activation function that consists in an approximate hyperbolic tangent function.

This function consists in:
if the input phase $\varphi_{in}$ is negative, applying a zero output phase $\varphi_{out}$,
if the input phase φin is positive and lower than 180°, copying the input phase to the output phase φout,
if the input phase $\varphi_{in}$ is higher than 180°, applying a constant output phase (for example equal to 180°) to the output phase $\varphi_{out}$.

This type of activation function allows certain non-linear aspects intrinsic to the transfer function of the phase-summing circuit such as represented by equation (4) to be taken into account. Specifically, nonlinearities related to the signs of the phase shifts may exist in certain phase value ranges.

Figure 12:
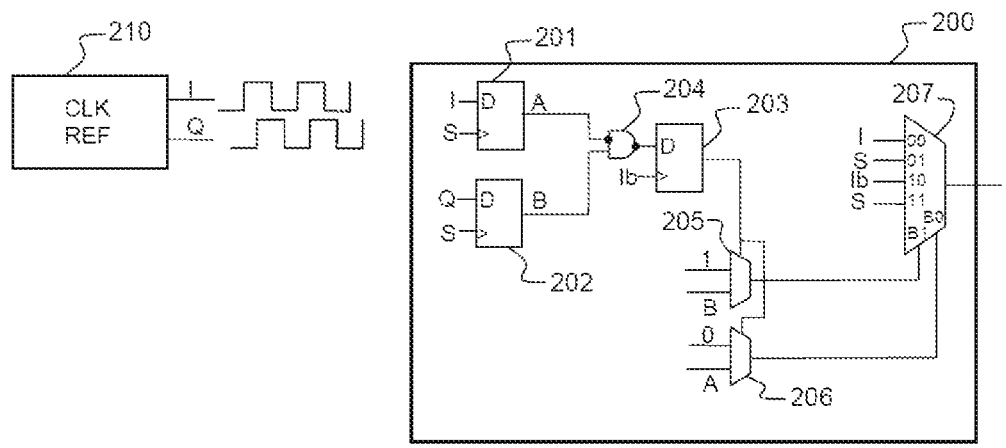
FIG. 12 shows a circuit diagram of one example of an activation circuit able to produce the activation function of FIG. 11.

FIG. 12 shows one example of an activation circuit 200 able to produce the activation function illustrated in FIG. 11.

The circuit 200 is driven by a reference clock 200 able to deliver two quadrature signals I and Q. The activation circuit 200 comprises a plurality of D flip-flops 201, 202, 203, a logic gate 204, and a plurality of routing circuits 205, 206, 207.

The circuit 200 selects an output from the input S, the clock signal I and the complementary signal Ib in the following way:
if the input phase S is zero, the output is equal to I,
if the input phase S is comprised between 0 and 180°, the output is equal to S,
if the input phase is higher than 180°, i.e. the rising edge of the signal S arrives after the falling edge of the signal I, the output is equal to Ib.

The respective positions of the rising edge of the signal S with respect to the rising edges of the signals I and Q are determined by the state of the three flip-flops 201, 202, 203.

The examples of FIGS. 9, 10, 11 and 12 are given purely by way of illustration and may be replaced by other implementations realizing the same activation functions or other functions.

Although the invention has been described in the context of an application to the design of artificial neural networks, it is not limited to this application alone and is employable in any application requiring a phase-summing circuit.

For example, the phase-summing circuit according to the invention may be used to produce a phase integrator or more generally an integrator of signals in the phase domain. For example, such a phase integrator may be used to produce a sigma-delta analogue-to-digital converter.

Although the invention has been described in detail with reference to an oscillator circuit locked by injection of current, it may be employed in any type of injection-locked oscillator circuit.

In a second embodiment of the invention, the oscillator used is a variable load impedance injection-locked oscillator such as described in patent application FR 1872714.

Figure 13:
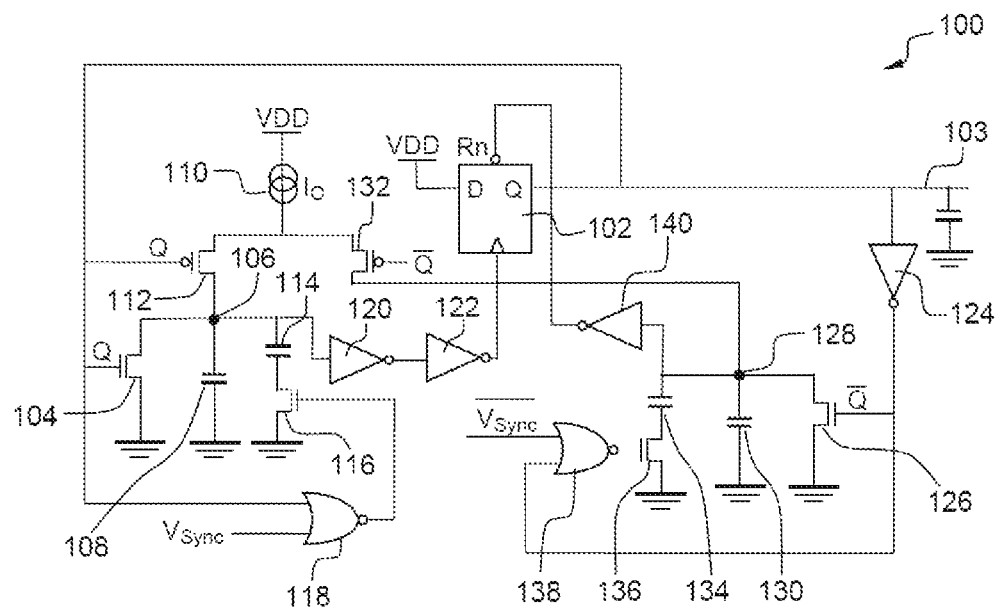
FIG. 13 shows a circuit diagram of an injection-locked oscillator circuit according to a second embodiment of the invention.

FIG. 13 illustrates an example of an oscillator circuit 100 locked by load-impedance injection.

The oscillator 100 comprises a flip-flop 102 that corresponds to a D flip-flop. The flip-flop 102 comprises a data input D coupled to a supply electric potential VDD. An output Q of the D flip-flop 102 is connected to an output 103 of the oscillator 100 and is coupled to the gate of a first discharging transistor 104. A first electrode of the first discharging transistor 104, corresponding to the drain of the first discharging transistor 104, which is of n-type, is coupled to a first node 106. A second electrode of the first discharging transistor 104, corresponding to the source of the first discharging transistor 104, is coupled to ground. The oscillator 100 also comprises a first load impedance 108. According to one example of embodiment, this first load impedance 108 corresponds to a first capacitor, or more generally to a first capacitive component, of capacitance $C_1$. A first electrode of the first capacitor is coupled to the first node 106, and a second electrode of the first capacitor is coupled to ground.

A charging current $I_0$, here corresponding to a control signal received by the oscillator 100 (this control signal has been represented by a current source 110 in FIG. 13), is applied to the first node 106, and therefore to the first load impedance 108, through a first input transistor 112. The output Q of the flip-flop 102 is coupled to the gate of the first input transistor 112.

The oscillator 100 further comprises a second load impedance 114, and a first coupling component 116 that is controlled and configured to periodically couple the second load impedance 114 to the first load impedance 108. According to one example of embodiment, this second load impedance 114 corresponds to a second capacitor, or second capacitive component, of capacitance $C_{synchro1}$, and the first coupling component 116 corresponds to a first coupling transistor 116. A first electrode of the second capacitor is connected to the first node 106. A second electrode of the second capacitor is connected to a first electrode of the first coupling transistor 116, and corresponds to the drain of the first coupling transistor 116, which is of n-type. A second electrode of the first coupling transistor 116, corresponding to the source of the first coupling transistor 116, is coupled to ground.

The gate of the first coupling transistor 116 is coupled to the output of a first NOR logic gate 118 comprising a first input coupled to the output Q of the flip-flop 102 and a second input to which a synchronization signal $V_{synchro}$ of frequency $f_{synchro}$ is applied. The synchronization signal for example corresponds to a square-wave signal the high and low values of which are about equal to those of the signal delivered on the output Q of the flip-flop 102. By virtue of the first NOR logic gate 118, the second load impedance 114 is coupled in parallel to the first load impedance 108 when the synchronization signal $V_{synchro}$ and the output signal of the flip-flop 102 are both in the low state.

The first node 106 is also coupled to the input of a first inverter 120, the output of this first inverter 120 being coupled to the input of a second inverter 122. The output of the second inverter 122 is coupled to the clock input of the flip-flop 102. These inverters 120, 122 allow the edge of the signal obtained on the first node 106 to be rectified before its application to the clock input of the flip-flop 102.

The output Q of the flip-flop 102 is also coupled to the input of a third inverter 124. Alternatively, the signal obtained on the output of the third inverter 124, corresponding to the signal of the inverted output $\overline{Q}$, could be obtained on an inverted output of the flip-flop 102. The output of the third inverter 124 is coupled to the gate of a second discharging transistor 126.

A first electrode of the second discharging transistor 126, corresponding to the drain of the second discharging transistor 126, which is of n-type, is coupled to a second node 128. A second electrode of the second discharging transistor 126, corresponding to the source of the second discharging transistor 126, is coupled to ground.

The oscillator 100 also comprises a third load impedance 130. In this first embodiment, this third load impedance 130 corresponds to a third capacitor, or third capacitive component, of capacitance $C_2$. A first electrode of the third capacitor is coupled to the second node 128, and a second electrode of the third capacitor is coupled to ground.

The charging current $I_0$ is applied to the second node 128, and therefore to the third load impedance 130, through a second input transistor 132. The signal of the inverted output $\overline{Q}$ of the flip-flop 102 is applied to the gate of the second input transistor 132.

The oscillator 100 further comprises a fourth load impedance 134, and a second coupling component 136 that is controlled and configured to periodically couple the fourth load impedance 134 to the third load impedance 108. In one example of embodiment, this fourth load impedance 134 corresponds to a fourth capacitor, or fourth capacitive component, of capacitance $C_{synchro2}$, and the second coupling component 136 corresponds to a second coupling transistor.

The capacitances of the capacitors of the oscillator 100 are here such that $C_1/C_{synchro1}=C_2/C_{synchro2}$.

A first electrode of the fourth capacitor is connected to the second node 128. A second electrode of the fourth capacitor is connected to a first electrode of the second coupling transistor, which corresponds to the drain of the second coupling transistor, which is of n-type. A second electrode of the second coupling transistor, corresponding to the source of the second coupling transistor, is coupled to ground.

The gate of the second coupling transistor is coupled to the output of a second NOR logic gate 138 comprising a first input coupled to the output of the third inverter 124 and a second input to which a signal that is the inverse of the synchronization signal $V_{synchro}$ and that is of frequency $f_{synchro}$ is applied. By virtue of the second NOR logic gate 138, the fourth load impedance 134 is coupled in parallel to the third load impedance 130 when the inverse signal of $V_{synchro}$ and the signal of the inverted output $\overline{Q}$ of the flip-flop 102 are both in the low state.

The second node 128 is also coupled to the input of a fourth inverter 140 the output of which is coupled to a reset input of the flip-flop 102. This inverter 140 allows the edge of the signal obtained on the second node 128 to be rectified before its application to the reset input of the flip-flop 102.

In the oscillator 100 described above, the transistors 104, 112, 116, 126, 132 and 136 are for example MOSFETs. Other types of transistors may however be used.

In the oscillator 100 shown in FIG. 13, the control signal corresponding to the charging current $I_0$ allows the natural frequency of the oscillator 100 to be controlled directly. The value of the natural frequency $f_0$ of the oscillator 100 is dependent on the amplitude of the charging current $I_0$, and therefore on the amplitude of the control signal received by the oscillator 100. This control signal may correspond to a measurement signal received by the oscillator 100, or indeed correspond to a signal obtained from a measurement signal, for example to a signal delivered as output by a transconductance amplifier an input of which receives the measurement signal.

In this oscillator 100, synchronization is not achieved via an injection of current (or of a voltage) that is added then subtracted from the control signal of the oscillator 100 at the frequency of the synchronization signal, but via a modification of the value of the one or more load impedances (the first and third load impedances 108, 130 in the example described above) of the oscillator 100, said modification occurring at the frequency of the synchronization signal $f_{synchro}$. The value of these one or more load impedances is modified by periodically coupling and decoupling one or more other load impedances (the second and fourth load impedances 114, 134 in the example described above) in series or in parallel (in parallel in the example described above) to these one or more load impedances. In the example described above, the first load assembly, comprising the first and second load impedances 108, 114, therefore forms a capacitor the capacitance of which alternates between the values $C_1$ and $C_1+C_{synchro1}$. Likewise, the second load assembly, comprising the third and fourth load impedances 130, 134, therefore forms a capacitor the capacitance of which alternates between the values $C_2$ and $C_2+C_{synchro2}$.

Thus, the oscillator 100 locks to the frequency of the synchronization signal while adjusting the phase of the signal delivered to the output 103, in such a way that the value of the average load impedance of the oscillator 100 becomes equal to that required for the oscillator 100 to oscillate freely (without synchronization signal applied to the input of the oscillator 100) at the frequency $f_{synchro}$ of the synchronization signal. Thus, the phase shift between the output signal delivered to the output 103 and the synchronization signal is dependent on the difference between the natural frequency $f_0$ of the oscillator 100 and the frequency $f_{synchro}$ of the synchronization signal $V_{synchro}$.

When $C_1=C_2$ and $C_{synchro1}=C_{synchro2}$, the signal obtained on the output 103 of the oscillator 100 has a duty cycle equal to 50% (over one period of this output signal, the duration of the high state is equal to the duration of the low state). The phase shift obtained between the synchronization signal and the signal delivered on the output 103 of the oscillator 100 may then be expressed by the following equation:

$$\varphi = \pi \left[ \frac{C_1}{C_{synchro1}} \left( \frac{f_0}{f_{synchro}} - 1 \right) \right]$$

In the second embodiment of the invention, the oscillator locked by injection of current illustrated in FIG. 5 is replaced by the oscillator illustrated in FIG. 13.

The neuronal circuit according to the invention illustrated in FIG. 7 is then similarly designed with a relaxation oscillator circuit and a plurality of injection interface circuits.

Each injection interface circuit is controlled by a different synchronization signal $V_{synchro}$, these signals being phase shifted with respect to one another, and parameterized by injection capacitances $C_{synchro1}, C_{synchro2}$ that are different for each circuit.

Returning to the example of FIG. 7, i.e. a neuronal circuit comprising a relaxation oscillator circuit and three injection interface circuits, and assuming that $C1=C2=C$ for the relaxation oscillator circuit and $C_{synchro1}=C_{synchro2}=dC_i$ for each injection interface circuit (i=0, 1, 2), the output signal of the oscillator has a phase shift with respect to the reference synchronization signal defined by the following relationship:

$$\varphi = \pi \cdot \frac{C}{dc0+dc1+dc2} * \left[ \frac{F_{sync}}{F_0} - 1 \right] + \frac{C \cdot (C+dc0+dc1+dc2)}{dc0+dc1+dc2}$$
$$\left[ \varphi_1 \cdot \frac{dc1}{(C+dc2) \cdot (C+dc1+dc2)} + \varphi_2 \cdot \frac{dc2}{(C) \cdot (C+dc2)} \right]$$

More generally, for a neuronal circuit comprising N injection interface circuits, it is possible to demonstrate that the phase shift may be expressed:
- $\varphi = \Sigma_{i=0}^{N-1} \omega_i \varphi_i + b$, with $\omega_i$ weighting coefficients that depend solely on the values of the capacitances C and $dC_i$ and b a bias that depends on the values of the capacitances C and $dC_i$ and on the values of the frequencies $F_{sync}$ and $F_0$, this bias being zero if $F_{sync}=F_0$.
- $\varphi_i$ corresponds to the phase shift between the synchronization signal of the injection interface circuit of index i and the reference synchronization signal (corresponding to the injection capacitance $dC_0$).

Variants of embodiment of the circuit of FIG. 13, which are described in patent application FR 1872714, may be used to realize variants of the circuit according to the invention.

REFERENCES

[1] D. Bankman et al. "An always-on 3.8 μJ/86% CIFAR-10 mixed-signal binary CNN processor with all memory on-chip in 28 nm CMOS", ISSCC 2018
[2] A. Valentian et al. "Fully Integrated Spiking Neural Network with Analog Neurons and RRAM synapses", IEEE IEDM 2019
[3] M. Romera et al. "Vowel recognition with four coupled spin-torque nano-oscillators", Nature vol 563, 8 Nov. 2018, p 230
[4] C. Jackson, A. Sharma, J. Bain, J. Weldon, L. Pileggi "An RRAM-Based Oscillatory Neural Network", IEEE LASCAS, February 2015

The invention claimed is:

1. A multi-injection phase-summing circuit comprising an oscillator having a natural frequency of oscillation F0, a reference injection interface circuit controlled by a reference synchronization signal at a reference frequency and at least one additional injection interface circuit controlled by a secondary synchronization signal at the reference frequency, each injection interface circuit having a variable injection parameter, the secondary synchronization signals each being phase shifted with respect to the reference synchronization signal, the oscillator being configured to generate an output signal at the reference frequency and phase shifted with respect to the reference synchronization signal by a phase shift dependent on a sum of the respective phase shifts of each secondary synchronization signal with respect to the reference synchronization signal, said sum being weighted by the injection parameters.

2. The phase-summing circuit according to claim 1, further comprising a converter of data into phases in order to control the respective phase shifts of the secondary synchronization signals with respect to the reference synchronization signal.

3. The phase-summing circuit according to claim 1, wherein the oscillator is a relaxation oscillator.

4. The phase-summing circuit according to claim 1, wherein the injection parameter is an injection current and each injection interface circuit is configured to inject, as input into the oscillator, the injection current synchronously with the synchronization signal that controls it.

5. The phase-summing circuit according to claim 4, wherein the oscillator comprises first and second capacitors (C1,C2) arranged to be in two opposite states among a charging state and a discharging state, respectively, each capacitor switching from the discharging state to the charging state by being charged by a current source (SC) internal to the oscillator.

6. The phase-summing circuit according to claim 5, wherein the oscillator comprises first and second charging transistors (N1,N2) and a flip-flop (BS) having a first data output coupled to the gate of the first transistor (N2) and a second data output, complementary to the first output, coupled to the gate of the second transistor (N1), the flip-flop (BS) furthermore having a synchronization input coupled to the first capacitor (C1) and a reset input coupled to the second capacitor (C2).

7. The phase-summing circuit according to claim 5, wherein each injection interface circuit is configured to charge or discharge the first and second capacitors (C1,C2) using the injection current.

8. The phase-summing circuit according to claim 4, wherein each injection interface circuit comprises one independent current source for generating the injection current.

9. The phase-summing circuit according to claim 4, wherein each injection interface circuit comprises an RRAM memory for generating the injection current.

10. The phase-summing circuit according to claim 1, wherein the injection parameter is a load impedance and each injection interface circuit is configured to modify the value of at least one load impedance of the oscillator synchronously with the synchronization signal that controls it.

11. The phase-summing circuit according to claim 1, wherein the reference frequency is set equal to the natural frequency of oscillation F0 of the oscillator.

12. The phase-summing circuit according to claim 1, wherein the oscillator is a nano-magnetic oscillator.

13. A neuronal circuit comprising a phase-summing circuit according to claim 1 and an actuation circuit in the phase domain configured to deliver as output an actuation signal that is a non-linear function of the signal output by the oscillator.

14. An oscillatory neural network comprising a plurality of neuronal circuits according to claim 13, wherein the signals propagated through the network are coded in phase and the synaptic weights of the network are coded depending on the values of the injection parameters of the injection interface circuits.

15. The oscillatory neural network according to claim 14, wherein the reference synchronization signal is common at least to all the neuronal circuits forming a given layer of neurons.

* * * * *